(12) United States Patent
Park et al.

(10) Patent No.: US 7,278,709 B2
(45) Date of Patent: Oct. 9, 2007

(54) PHOTO-CURABLE RESIN COMPOSITION, METHOD OF PATTERNING THE SAME, AND INK JET HEAD AND METHOD OF FABRICATING THE SAME

(75) Inventors: Byung-ha Park, Suwon-si (KR); Young-ung Ha, Suwon-si (KR); Sung-joon Park, Suwon-si (KR); Myong-jong Kwon, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 133 days.

(21) Appl. No.: 11/004,939

(22) Filed: Dec. 7, 2004

(65) Prior Publication Data
US 2005/0255409 A1    Nov. 17, 2005

(30) Foreign Application Priority Data
May 14, 2004    (KR) ............... 10-2004-0034430

(51) Int. Cl.
*B41J 2/04* (2006.01)
*B41J 2/05* (2006.01)
(52) U.S. Cl. .................................. 347/54; 347/65
(58) Field of Classification Search ............ 347/54–67
See application file for complete search history.

(56) References Cited

U.S. PATENT DOCUMENTS 5,907,333 A * 5/1999 Patil et al. .................. 347/20

6,158,843 A * 12/2000 Murthy et al. ............... 347/47

FOREIGN PATENT DOCUMENTS

| JP | 06-059449 | 3/1994 |
| JP | 10-338798 | 12/1998 |
| JP | 11-024254 | 1/1999 |
| KR | 2003-37772 | 5/2003 |

OTHER PUBLICATIONS

Korean Office Action dated Nov. 15, 2005 issued in KR 2004-34430.

* cited by examiner

*Primary Examiner*—Julian D. Huffman
*Assistant Examiner*—Geoffrey S. Mruk
(74) *Attorney, Agent, or Firm*—Stanzione & Kim, LLP

(57) ABSTRACT

A photo-curable resin composition, a method of patterning the same, an ink jet head, and a method of fabricating the same. The photo-curable resin composition includes an epoxy compound, a photo-catalyst provided as a photo-initiator, and a non-photo reactive solvent. The photo-catalyst may be a semiconductor material to generate electron-hall pairs using light energy. The semiconductor material is one selected from a group consisting of $TiO_2$, CdS, Si, $SrTiO_3$, WO, ZnO, $SnO_2$, CdSe and CdTe, CdSe and CdTe. The epoxy compound may include a di-functional epoxy compound and a multi-functional epoxy compound. The non-photo reactive solvent may be one or a mixture selected from a group consisting of gamma-butyrolactone (GBL), cyclopentanone, C1-6 acetate, tetrahydrofurane (THF), and xylene. The photo-curable resin composition is patterned to form a fluid channel structure of the ink jet head.

7 Claims, 4 Drawing Sheets

PHOTO-CURABLE RESIN COMPOSITION, METHOD OF PATTERNING THE SAME, AND INK JET HEAD AND METHOD OF FABRICATING THE SAME

CROSS-REFERENCE TO RELATED APPLICATIONS

This application claims the benefit of Korean Patent Application No. 2004-34430, filed May 14, 2004, the disclosure of which is hereby incorporated herein by reference in its entirety.

BACKGROUND OF THE INVENTION

1. Field of the Invention

The present general inventive concept relates to a photo-curable resin composition, a method of patterning the photo-curable resin composition layer, and an ink jet head and method of fabricating the same and, more particularly, to a photo-curable resin composition including a photo-catalyst as a photo-initiator, a method of patterning a photo-curable resin layer made of the photo-curable resin composition, an ink jet head having the photo-curable resin layer, and a method of fabricating the same.

2. Description of the Related Art

An ink jet recording device functions to print an image by ejecting fine droplets of ink to a desired position of a recording medium. Such an ink jet recording device has been widely used since its price is low and numerous kinds of colors can be printed at a high resolution. The ink jet recording device basically includes an ink jet head for actually ejecting the ink and an ink container in fluid communication with the ink jet head. The ink stored in the ink container is supplied into the ink jet head through an ink channel, and the ink jet head ejects the ink supplied from the ink container to the recording medium to thereby complete a printing operation. An ink ejection type of the ink jet recording device is classified into an electro-thermal transducer type (hereinafter, referred to as "bubble-jet type") ejecting the ink by generating bubbles in the ink using a heat source and an electro-mechanical transducer type ejecting the ink by controlling a change of an ink volume using deformation of a piezo-electric body used therein.

FIG. 1 is a perspective view illustrating a conventional bubble-jet ink jet head disclosed in U.S. Pat. No. 4,882,595.

Referring to FIG. 1, the bubble-jet ink jet print head includes a substrate 10, a chamber plate 14 disposed on the substrate 10 to form an ink chamber 12 for receiving the ink, a heat-generating resistor 16 disposed in the ink chamber 12, and a nozzle plate 20 having a nozzle 18 for ejecting the ink. The ink is filled in the ink chamber 12 through a restrictor 22, and also filled in the nozzle 18 in fluid communication with the ink chamber 12 using a capillary phenomenon. When the heat-generating resistor 16 is energized, the heat-generating resistor 16 generates heat to form bubbles in the ink filled in the ink chamber 12. As the bubbles are expanded, the ink filled in the ink chamber 12 is pressurized to eject the ink through the nozzle 18.

In order to make the ink jet printer operate reliably and stably, each component disclosed hereinabove should satisfy predetermined conditions. In particular, the chamber plate 14 and the nozzle plate 20 should satisfy the following conditions as a structure for forming a fluid channel (hereinafter, referred to as "fluid channel structure"), in which the ink is moved and temporarily stored. That is, the chamber plate 14 and the nozzle plate 20 should have a high mechanical strength for maintaining a structural shape, the substrate 10 and other layers should have good adhesive properties, and the ink should have corrosion resistance properties. In addition, the chamber plate 14 and the nozzle plate 20 should have a fine structure so as to perform patterning, and should also have good photosensitivity and resolution for patterning the chamber plate 14 and the nozzle plate 20.

Research on a photo-curable resin composition as a material of a fluid channel structure satisfying the above-described conditions has been performed. For example, U.S. Pat. No. 4,623,676 discloses a photo-curable composition containing a polymerizable acrylic compound, a polymerizable epoxy functional silane, and a free radical aromatic complex salt photo-initiator. Further, U.S. Pat. No. 5,907,333 discloses a photo-curable resin composition containing a di-functional epoxy compound, a multi-functional epoxy compound, an aromatic complex salt photo-initiator and a non-photo reactive solvent.

Furthermore, U.S. Pat. No. 4,090,936, U.S. Pat. No. 5,478,606, etc., discloses various photo-curable resin compositions. However, none of the disclosed photo-curable resign compositions entirely satisfy the conditions described above. Therefore, the research on the fluid channel structure needs to be continuously performed to satisfy at least the above conditions.

SUMMARY OF THE INVENTION

In order to solve the foregoing and/or other problems, it is an aspect of the general inventive concept to provide a photo-curable resin composition, which adopts a photo-catalyst as a photo-initiator, a method of patterning a photo-curable resin layer formed of the photo-curable resin composition, and an ink jet head having the photo-curable resin layer, and a method of fabricating the same.

Additional aspects and advantages of the present general inventive concept will be set forth in part in the description which follows and, in part, will be obvious from the description, or may be learned by practice of the general inventive concept.

The foregoing and/or other aspects of the present general inventive concept may be achieved by providing a photo-curable resin composition including an epoxy compound, a photo-catalyst provided as a photo-initiator, and a non-photo reactive solvent. The photo-catalyst may be a material to generate electron-hole pairs. For example, the photo-catalyst may be one selected from a group consisting of $TiO_2$, CdS, Si, $SrTiO_3$, WO, ZnO, $SnO_2$, CdSe and CdTe.

The epoxy compound may include a di-functional epoxy compound and a multi-functional epoxy compound. The non-photo reactive solvent may be one or a mixture selected from a group consisting of gamma-butyrolactone (GBL), cyclopentanone, C1-6 acetate, tetrahydrofurane (THF), and xylene.

In an aspect of the present general inventive concept, the photo-curable resin composition may include the epoxy compound of about 60 wt %, the photo-catalyst of about 2~10 wt %, and the non-photo reactive solvent of about 10~40 wt %.

The foregoing and/or other aspects of the present general inventive concept, may also be achieved by providing an ink jet head including a photo-curable resin layer made of a photo-curable resin composition. The ink jet head may include a substrate having a pressure-generating element to generate a pressure for ink ejection. A chamber plate formed by patterning the photo-curable resin layer including an epoxy compound, a photo-catalyst provided as a photo-initiator, and a non-photo reactive solvent can be disposed on the substrate, while a sidewall of a fluid channel through which the ink is moved is configured. A nozzle plate having a nozzle corresponding to the pressure-generating element can be disposed on the chamber plate. In another aspect of the present general inventive concept, the chamber plate and/or the nozzle plate may be a resin layer formed by patterning the novel photo-curable resin layer.

The foregoing and/or other aspects of the present general inventive concept may also be achieved by providing a method of fabricating the ink jet head, the method including preparing a substrate having a pressure-generating element to generate pressure for ink ejection, and forming on the substrate a chamber plate configuring a sidewall of a fluid channel, through which ink is moved, and a nozzle plate configuring an upper surface of the fluid channel and having a nozzle corresponding to the pressure-generating element, wherein at least the chamber plate can be formed by patterning a photo-curable resin layer including an epoxy compound, a photo-catalyst provided as a photo-initiator, and a non-photo reactive solvent. In an aspect of the present general inventive concept, the chamber plate and/or the nozzle plate may be formed by patterning the photo-curable resin layer.

In another aspect of the present general inventive concept, the method of fabricating the ink jet head may include patterning the photo-curable resin layer. The photo-curable resin layer may be patterned by a photolithography process. The patterning of the photo-curable resin layer may include forming the photo-curable resin layer on the substrate. The photo-curable resin layer can be selectively exposed using a photo-mask. Next, unexposed portions of the photo-curable resin layer can be removed.

BRIEF DESCRIPTION OF THE DRAWINGS

These and/or other aspects and advantages of the present general inventive concept will become apparent and more readily appreciated from the following description of the embodiments, taken in conjunction with the accompanying drawings of which.

DETAILED DESCRIPTION OF THE PREFERRED EMBODIMENTS

Figure 1:
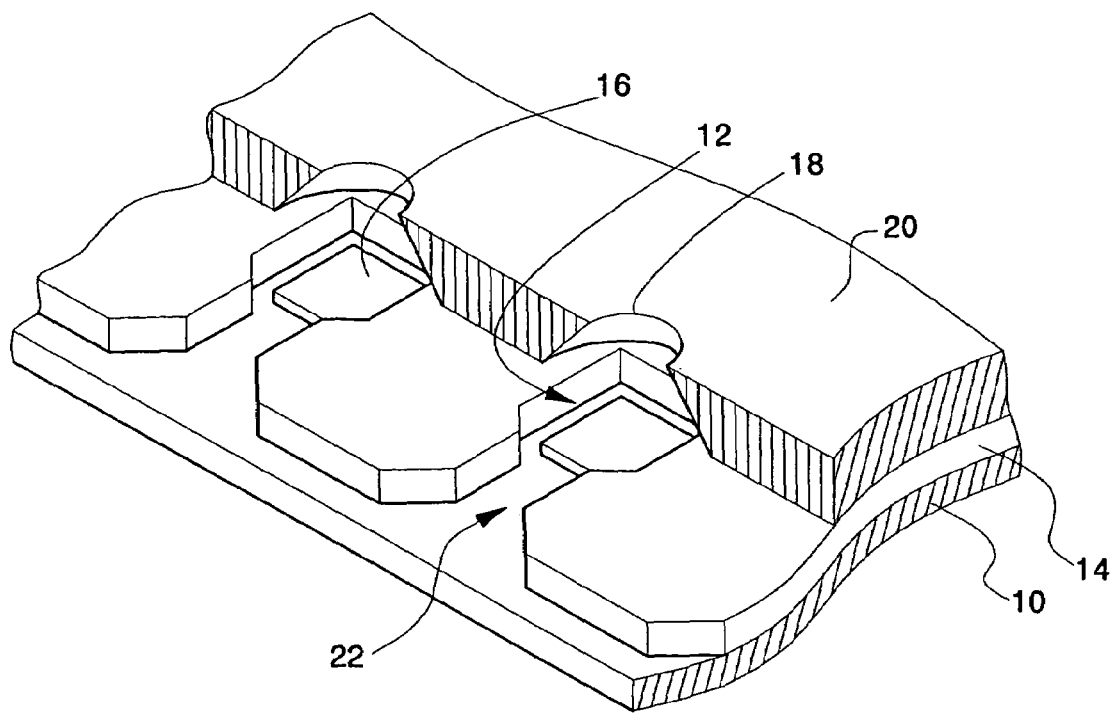
FIG. 1 is a perspective view illustrating a conventional bubble-jet ink jet print head.

The present invention will now be described more fully hereinafter with reference to the accompanying drawings, in which exemplary embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout the specification.

First, an ink jet head in accordance with an embodiment of the present general inventive concept will be described with reference to FIG. 6.

Figure 6:
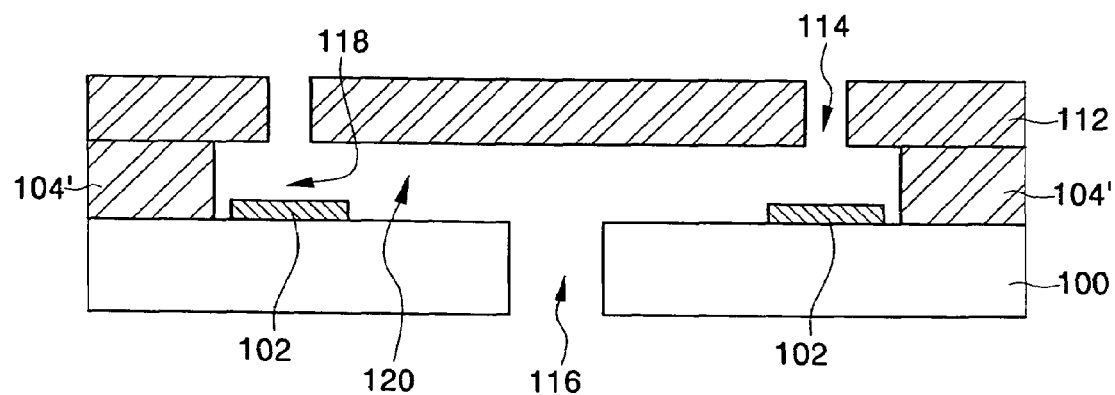

Referring to FIG. 6, pressure-generating elements 102 to generate pressure for ink ejection can be disposed on a substrate 100. The substrate 100 can be a silicone substrate having a thickness of about 500 µm. It is effective in mass production since the silicone substrate widely used in manufacturing a semiconductor device can be used as it is. The pressure-generating-elements 102 may be a heat-generating resistor made of a high-resistance metal such as a tantalum-aluminum alloy. A chamber plate 104' can be disposed on the substrate having the pressure-generating elements 102. The chamber plate 104' configures a sidewall of a fluid channel including a pressure chamber 118 and a restrictor 120. A nozzle plate 112 having nozzles 114 corresponding to the pressure-generating elements 102 can be disposed on the chamber plate 104'. An ink supply hole 116 passing through the substrate 100 can be disposed on a center portion of the substrate 100.

The ink supplied from an ink container, such as a cartridge (not shown), can pass through the ink supply hole 116 and the restrictor 120 sequentially to be temporarily stored in the ink chamber 118. The ink stored in the ink chamber 118 can be instantly heated by a heat-generating unit, i.e., the pressure-generating element 102, to be ejected in a shape of a droplet through the nozzles 114 by the pressure generated by the pressure-generating elements 102.

In an aspect of the present general inventive concept, the chamber plate 104' and/or the nozzle plate 112 can be made of a novel photo-curable resin composition including a photo-catalyst as a photo-initiator. The photo-curable resin composition may include an epoxy compound, a photo-catalyst, and a non-photo reactive solvent. The photo-curable resin composition may include a photo-catalyst as a photo-initiator to induce a cross-link between epoxy compounds existing in a monomer or oligomer state.

Hereinafter, each component of the photo-curable resin composition will be described.

First, the epoxy compound may include a multi-functional epoxy compound and a di-functional epoxy compound. The multi-functional epoxy compound functions to increase cross-link density to improve resolution and solvent swelling. The multi-functional epoxy compound may be, for example, a novolac epoxy resin. The novolac epoxy resin is available from Dow Chemical Company, as a trade name entitled "D.E.N. 431". The di-functional epoxy compound functions to add tensile strength and elastomeric properties to a resin layer. The di-functional epoxy compound may be, for example, diglycidyl ether bisphenol A, available from Shell Chemical Company, as a trade name entitled "EPON1010F, EPON828 or EPON1004". In an aspect of the present general inventive concept, the epoxy compound including the multi-functional epoxy compound and the di-functional epoxy compound may have about 60 wt % with respect to a total weight of the resin composition.

The photo-catalyst can be provided as the photo-initiator to induce the cross-link between the epoxy compounds. The photo-catalyst may be a material to generate electron-hole pairs using light energy. In an aspect of the present general inventive concept, the photo-catalyst may be one selected from a group consisting of $TiO_2$, CdS, Si, $SrTiO_3$, WO, ZnO, $SnO_2$, CdSe and CdTe. When the photo-catalyst is exposed by a light source having a wavelength equal to or less than 400 nm to be energized, electrons exiting in a valence band can be excited to a conduction band to generate the electron-hole pairs. The generated electron-hole pairs can be interacted with oxygen of an epoxy radical composing the epoxy compound, and the oxygen forming an epoxy ring may have a negative polarity compared to carbon, thus weakening a bonding strength between the oxygen and the carbon. As a result, a ring opening, in which one of two bondings between the oxygen and the carbon forming the epoxy ring is cut off, can be generated, and the carbon can be bonded to oxygen of another epoxy ring. The epoxy compound can be changed from a low molecular weight to a high molecular weight through the ring opening and the cross-link, and a high molecular chain can form a network structure to be cured. In this embodiment of the present general inventive concept, the photo-catalyst may have about 2~10 wt % with respect to a total weight of the resin composition.

Next, the non-photo reactive solvent, which is capable of dissolving the epoxy compound and the photo-catalyst, may be, for example, one or a mixture selected from a group consisting of gamma-butyrolactone (GBL), cyclopentanone, C1-6 acetate, tetrahydrofurane (THF), and xylene. The non-photo reactive solvent may have about 10~40 wt % with respect to the total weight of the resin composition. Besides, the photo-curable resin composition may add selective additives, such as silane coupling to improve adhesive properties, to the substrate and may also add a dye or surfactant to adjust an extinction coefficient of the photo-curable resin composition, to the substrate.

As described above, the ink jet head may have the chamber plate 104' and/or the nozzle plate 112 made of the photo-curable epoxy resin composition including the photo-catalyst as the photo-initiator. Although the embodiment of the present general inventive concept has been described about the bubble-jet ink jet head employing a top shooting method, the present general inventive concept will not be limited thereto, and the photo-curable epoxy resin can be applied as materials for various fluid channel structures forming the fluid channel.

Hereinafter, a method of fabricating an ink jet head in accordance with another embodiment of the present general inventive concept will be described.

FIGS. 2 to 6 are cross-sectional views illustrating the method of fabricating the ink jet head according to another embodiment of the present general inventive concept.

Figure 2:
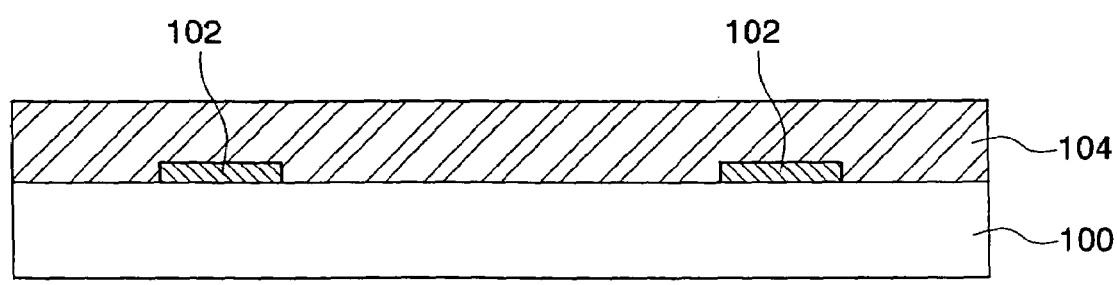
FIGS. 2 to 6 are cross-sectional views illustrating a method of fabricating an ink jet head in accordance with one embodiment of the present general inventive concept.

Referring to FIG. 2, a substrate 100 can be prepared. The substrate 100 may be a silicone substrate used in a process of manufacturing a semiconductor device. Pressure-generating elements 102 are formed on the substrate 100. In an aspect of the present general inventive concept, the pressure-generating elements 102 may be a heat-generating resistor made of a high-resistance metal, such as a tantalum-aluminum alloy. Besides, interconnection lines to supply electrical signals to the pressure-generating elements 102, a conductive pad to electrically connect the pressure-generating elements 102 to an external circuit, a silicone oxide heat barrier layer to cover the substrate 100, and a passivation layer to protect the above structures may be formed on the substrate 100. A formation method and a material of the structures including the pressure-generating elements 102 will not be intended to limit the scope of the present general inventive concept, and it will be understood that the method and the material can be variously modified by technologies known to those skilled in the art. Therefore, their descriptions will be omitted.

A photo-curable resin layer 104 can be formed on the substrate 100 having the pressure-generating elements 102. The photo-curable resin layer 104 may be formed by a spin coating method. The photo-curable resin layer 104 can be formed of the photo-curable resin composition including an epoxy compound, a photo-catalyst provided as a photo-initiator, a non-photo reactive solvent, and a selective additive as described above.

Figure 3:
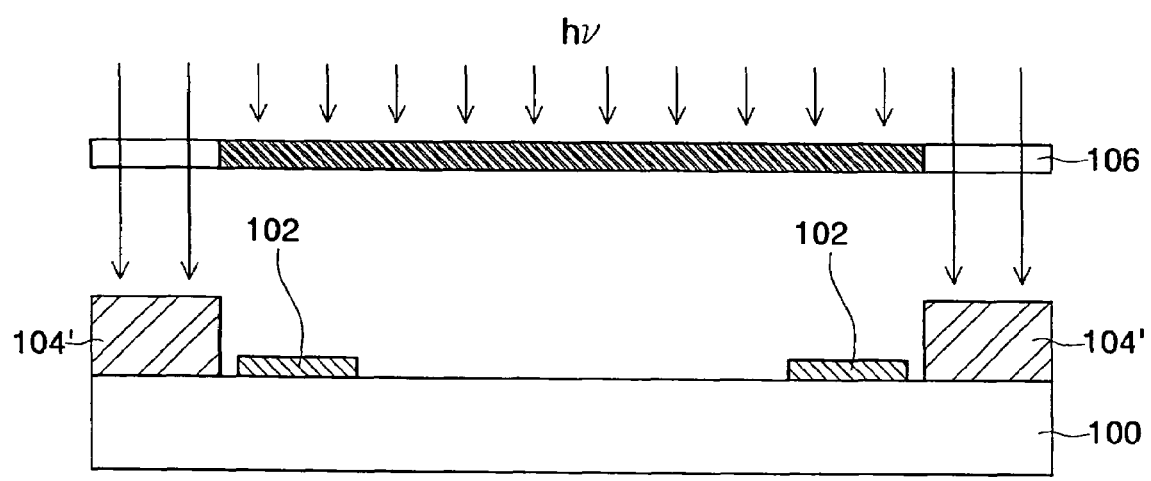

Referring to FIG. 3, the photo-curable resin layer 104 can be patterned to form a chamber plate 104' configuring a sidewall of a fluid channel through which the ink is moved. That is, the chamber plate 104' can be formed by patterning the photo-curable resin layer 104. The photo-curable resin layer 104 may be patterned by a photolithography process. More specifically, first, the photo-curable resin layer 104 is formed, and then a soft baking operation can be performed on the photo-curable resin layer 104 at low temperature in order to remove a solvent ingredient. Next, the photo-curable resin layer 104 can be selectively exposed using a first photo-mask 106 provided with a fluid channel pattern. UV or DUV (deep ultra violate) having a wavelength equal to or less than 400 nm, for example, I-line having a wavelength of about 365 nm, KrF laser having a wavelength of about 248 nm, or ArF laser having a wavelength of about 193 nm, may be employed as a light source hv during the exposure operation. As a result of the exposure operation, an exposed portion of the photo-curable resin layer 104 can be cross-linked by the photo-catalyst added as the photo-initiator to thereby be cured. An unexposed portion of the photo-curable resin layer 104 can still exist in a low molecular state, for example, a monomer or oligomer state. Then, the unexposed portion of the photo-curable resin layer 104 can be removed. The unexposed portion of the photo-curable resin layer 104 may be easily removed using, for example, a solvent consisting of a developer, acetone, a halogen element, or an alkaline solvent. As a result, as shown in FIG. 3, the chamber plate 104' can be formed on the substrate 100. In the meantime, before the unexposed portion is removed, a post-exposure bake operation may be selectively performed. The post-exposure bake operation may be performed at a temperature of about 60~95° C. in order to further cure the photo-curable resin layer 104 at the exposed portion.

After the chamber plate 104' is formed, a process of forming a nozzle plate having a nozzle to eject the ink on the chamber plate 104' is performed. The nozzle plate may be formed by various methods. For example, the nozzle plate may be formed of a metal, such as nickel, using an electro-forming, then may be attached to the chamber plate 104'. In an aspect of the present general inventive concept, the nozzle plate can be monolithically formed using the same material as the chamber plate 104'. Hereinafter, a method of monolithically forming the nozzle plate will be described.

Figure 4:
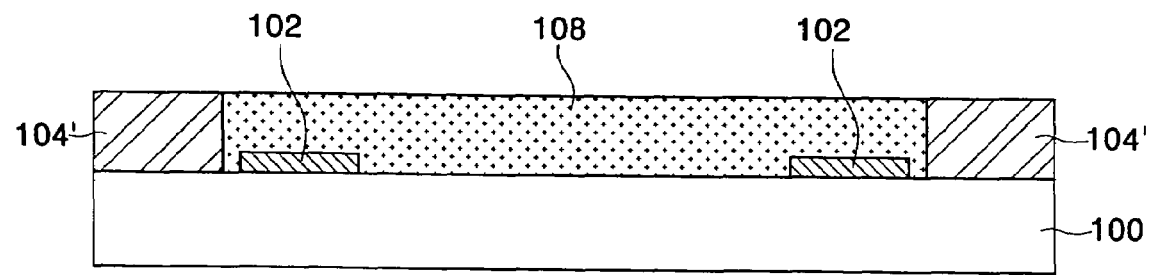

Referring to FIG. 4, a positive photo-resist can be formed to fill a space between the chamber plates 104' so that the chamber plate 104' is covered on an entire surface of the substrate 100 having the chamber plate 104'. After that, a planarization process, such as a chemical mechanical polishing (CMP) process, can be performed to expose an upper surface of the chamber plate 104' to thereby form a sacrificial mold layer 108 filling between the chamber plates 104'. In the meantime, a thickness of the chamber plate 104' may be somewhat decreased while performing the CMP process.

Figure 5:
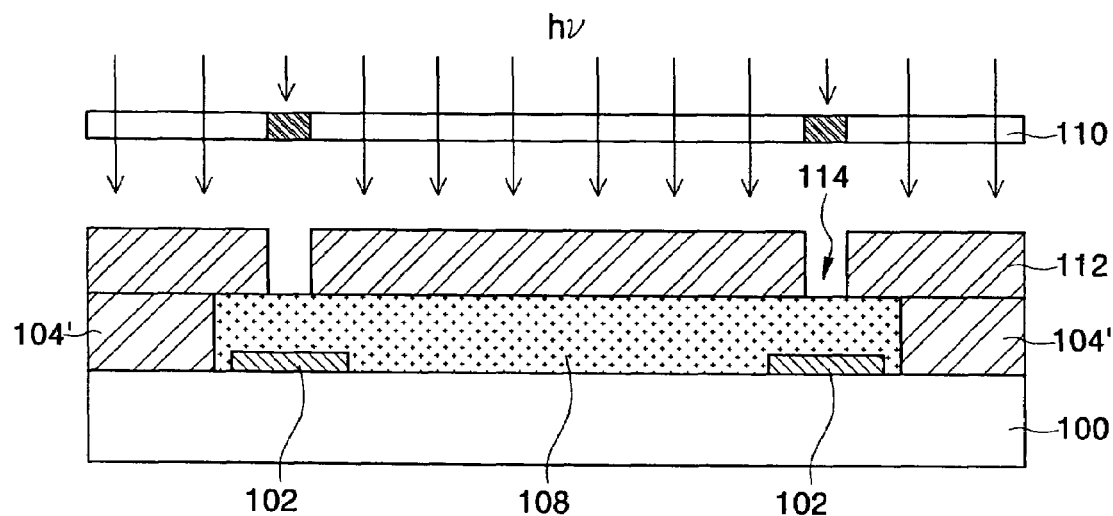

Referring to FIG. 5, a nozzle material layer can be formed on an entire surface of the chamber plate 104' and the sacrificial mold layer 108. The nozzle material layer may be formed of the photo-curable epoxy resin composition, which is the same material as the chamber plate 104'. After that, the nozzle material layer formed of the photo-curable epoxy resin composition can be patterned. The patterning of the nozzle material layer can be similar to the process of forming the chamber plate 104' described above. Briefly describing, the nozzle material layer can be exposed to a light source hv using a second photo-mask 110 provided with a nozzle pattern. After that, an unexposed portion of the nozzle material layer can be removed using the solvent. As a result, as shown in FIG. 5, a nozzle plate 112 having nozzles 114 corresponding to the pressure-generating elements 102 can be formed.

Referring to FIG. 6, the substrate 100 can be etched to form an ink supply hole 116 passing through the substrate 100, and then the sacrificial mold layer 108 can be removed using an appropriate solvent. As a result, the fluid channel including the ink chamber 118 and the restrictor 120 can be formed at a region where the sacrificial mold layer 108 is removed.

Figure 7:
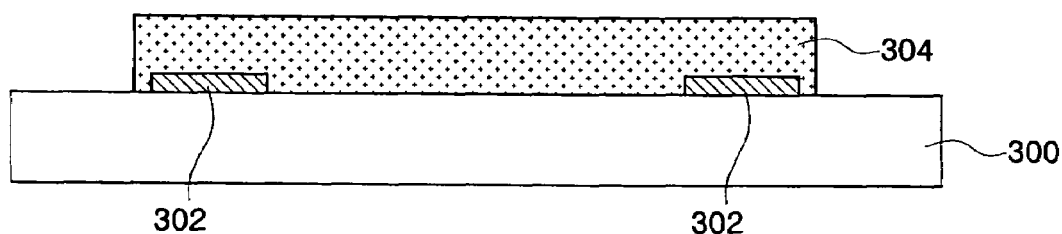
FIGS. 7 and 8 are cross-sectional views illustrating a method of fabricating an ink jet head in accordance with another embodiment of the present general inventive concept.
Figure 8:
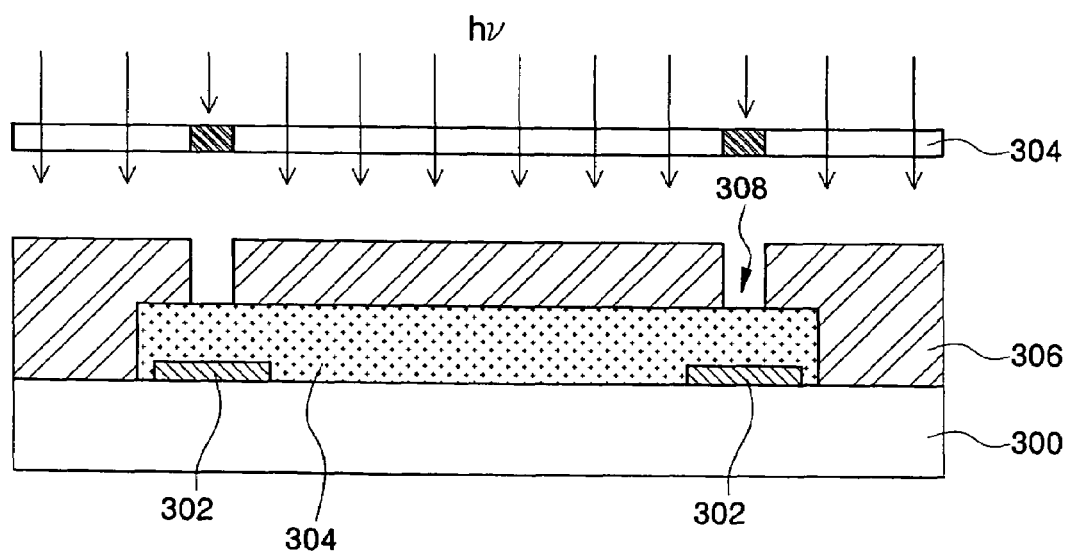

FIGS. 7 and 8 are cross-sectional views illustrating a method of fabricating an ink jet head in accordance with another embodiment of the present general inventive concept. In an aspect of the present general inventive concept, a chamber plate and a nozzle plate may be simultaneously formed by one photolithography process.

Referring to FIGS. 7 and 8, a sacrificial mold layer 304 can be formed on a substrate 300 provided with pressure-generating elements 302. The sacrificial mold layer 304 may be formed by patterning a positive photo-resist using a photolithography process. The sacrificial mold layer 304 is formed on the substrate 300 to cover a region where a fluid channel is to be formed. Next, a photo-curable epoxy resin layer covering the sacrificial mold layer 304 can be formed on the substrate having the sacrificial mold layer 304. As described above, the photo-curable epoxy resin layer may include an epoxy compound, a photo-catalyst provided as a photo-initiator, and a non-photo reactive solvent. Next, as shown in FIG. 8, the photo-curable epoxy resin layer can be exposed to a light source hv using a photo-mask 304 provided with a nozzle pattern. As a result, a fluid channel structure 306 having nozzles 308 corresponding to the pressure-generating elements 302 can be formed on the substrate 300. After that, subsequent processes described in previous embodiment of the present general inventive concept can be performed to form an ink supply hole and remove the sacrificial mold layer 304.

As described above, the present general inventive concept may form the fluid channel structure forming the fluid channel of the ink jet head using the photo-curable resin composition including the photo-catalyst provided as the photo-initiator.

Although a few embodiments of the present general inventive concept have been shown and described, it will be appreciated by those skilled in the art that changes may be made in these embodiments without departing from the principles and spirit of the general inventive concept, the scope of which is defined in the appended claims and their equivalents.

What is claimed is:

1. An ink jet head comprising:
    a substrate having a pressure-generating element to generate a pressure for ink ejection;
    a chamber plate disposed on the substrate to configure a sidewall of a fluid channel, through which ink is moved, and formed by patterning a photo-curable resin layer including an epoxy compound, a photo-catalyst provided as a photo-initiator comprising one selected from a group consisting of $TiO_2$, CdS, $SrTiO_3$, WO, ZnO, $SnO_2$, CdSe and CdTe, and a non-photo reactive solvent; and
    a nozzle plate disposed on the chamber plate, and having a nozzle corresponding to the pressure-generating element.

2. The ink jet head according to claim 1, wherein the photo-catalyst comprises a material to generate electron hole pairs using light energy.

3. The ink jet head according to claim 2, wherein the epoxy compound comprises a di-functional epoxy compound and a multi-functional epoxy compound.

4. The ink jet head according to claim 3, wherein the photo-curable resin layer comprises the epoxy compound of about 60 wt %, the photo-catalyst of about 2 ~10 wt %, and the non-photo reactive solvent of about 10 40 wt %.

5. The ink jet head according to claim 1, wherein the nozzle plate is made of the same photo-curable resin layer as the chamber plate.

6. The ink jet head according to claim 5, wherein the nozzle plate and the chamber plate are formed in a monolithic single body.

7. An ink jet head, comprising:
    a substrate having a pressure-generating element to generate a pressure for ink ejection;
    a chamber plate disposed on the substrate to configure a sidewall of a fluid channel, through which ink is moved, and formed by patterning a photo-curable resin layer including an epoxy compound, a photo-catalyst provided as a photo-initiator comprising Silicon, and a non-photo reactive solvent; and
    a nozzle plate disposed on the chamber plate, and having a nozzle corresponding to the pressure-generating element.

* * * * *